United States Patent
Chen et al.

(10) Patent No.: US 9,741,451 B2
(45) Date of Patent: Aug. 22, 2017

(54) DATA STORAGE DEVICE AND DATA MAINTENANCE METHOD THEREOF

(71) Applicant: Silicon Motion, Inc., Jhubei (TW)

(72) Inventors: Ching-Ke Chen, Taichung (TW); Po-Sheng Chou, Toufen Township (TW); Yang-Chih Shen, Taipei (TW)

(73) Assignee: Silicon Motion, Inc., Jhubei (TW)

( * ) Notice: Subject to any disclaimer, the term of this patent is extended or adjusted under 35 U.S.C. 154(b) by 103 days.

(21) Appl. No.: 14/711,472

(22) Filed: May 13, 2015

(65) Prior Publication Data

US 2016/0103734 A1   Apr. 14, 2016

(30) Foreign Application Priority Data

Oct. 14, 2014   (TW) .............................. 103135459 A (51) Int. Cl.
*G06F 13/00* (2006.01)
*G11C 29/52* (2006.01)
*G06F 11/10* (2006.01)
*G11C 29/04* (2006.01)

(52) U.S. Cl.
CPC .......... *G11C 29/52* (2013.01); *G06F 11/1076* (2013.01); *G11C 2029/0411* (2013.01)

(58) Field of Classification Search
CPC ......... G06F 12/0246; G06F 2212/7207; G06F 11/1072; G06F 11/1076; G11C 2211/5641; G11C 7/1006; H03M 13/05
See application file for complete search history.

(56) References Cited

U.S. PATENT DOCUMENTS

| 8,751,896 | B2 | 6/2014 | Yamaga | |
|---|---|---|---|---|
| 9,026,867 | B1* | 5/2015 | Northcott | G06F 11/1048 365/185.09 |
| 9,053,012 | B1* | 6/2015 | Northcott | G06F 12/0246 |
| 2013/0290629 | A1* | 10/2013 | Uehara | G06F 3/0688 711/114 |
| 2014/0013033 | A1* | 1/2014 | Sharon | G06F 11/1072 711/103 |
| 2014/0245105 | A1* | 8/2014 | Chung | G06F 11/1048 714/763 |

OTHER PUBLICATIONS

Office Action of corresponding TW application, published on Feb. 23, 2016, (Feb. 25, 2016).

* cited by examiner

*Primary Examiner* — Phung M Chung
(74) *Attorney, Agent, or Firm* — Wang Law Firm, Inc.

(57) ABSTRACT

A data storage device including a flash memory and a controller. The flash memory includes a plurality of chips, each of the chips includes a plurality of pages, the pages are arranged to assemble into a super block, the pages of the super block are numbered 0~X from top to bottom of the super block, the pages with number 0~Y−1 constitute a data area, and the pages with numbers Y~X constitute a RAID parity area. The controller corrects data of the data area according to data of the RAID parity area when the data in the data area cannot be successfully read.

16 Claims, 13 Drawing Sheets

| RG0 |
|---|
| C0_P0 |
| C1_P0 |
| C2_P0 |
| ⋮ |
| C15_P0 |
| C0_P1 |
| C1_P1 |
| C2_P1 |
| ⋮ |
| C15_P3 |
| C0_P4 |
| C1_P4 |
| C2_P4 |
| ⋮ |
| C14_P4 |
| C15_P4 |

| RG1 |
|---|
| C0_P5 |
| C1_P5 |
| C2_P5 |
| ⋮ |
| C15_P5 |
| C0_P6 |
| C1_P6 |
| C2_P6 |
| ⋮ |
| C15_P8 |
| C0_P9 |
| C1_P9 |
| C2_P9 |
| ⋮ |
| C14_P9 |
| C15_P9 |

DATA STORAGE DEVICE AND DATA MAINTENANCE METHOD THEREOF

CROSS REFERENCE TO RELATED APPLICATIONS

This application claims priority of Taiwan Patent Application No. 103135459, filed on Oct. 14, 2014, the entirety of which is incorporated by reference herein.

BACKGROUND OF THE INVENTION

Field of the Invention

The present invention relates to a data maintenance method applied to a memory device, and in particular to a data maintenance method applied to a super block.

Description of the Related Art

Flash memory is considered a non-volatile data storage device, using electrical methods to erase and program itself. Taking NAND Flash as an example, it is often used in memory cards, USB flash devices, solid state devices, eMMC, and other uses.

Flash memory, such as NAND FLASH, includes a plurality of blocks. Each of the blocks has a plurality of pages, wherein the unit of a write operation is one page, and the unit of an erase operation is one block. The stored data may be read incorrectly from the flash memory. The current solution is encoding the original data, which is arranged to be stored into the flash memory, and storing the encoded data into the flash memory, such that the encoded data will be retrieve and decoded to obtain the original data during the read operation. Although the encode/decode process may correct most of the error data, the way to store the encoded data effects the performance of the flash.

BRIEF SUMMARY OF THE INVENTION

A detailed description is given in the following embodiments with reference to the accompanying drawings.

An exemplary embodiment provides a data storage device including a flash memory and a controller. The flash memory includes a plurality of chips, each of the chips includes a plurality of pages, the pages of the chips are arranged to assemble into a super block according to a predetermined arrangement order, the pages of the super block are numbered 0~X from top to bottom of the super block, the pages with number 0~Y−1 constitute a data area, and the pages with numbers Y~X constitute a RAID parity area, wherein the X is an integer greater than 1, and Y is an integer greater than 1 and less than X. The controller corrects data of the data area according to the data of the RAID parity area when the data of the data area cannot be successfully read.

Another exemplary embodiment provides a data maintenance method applied to a data storage device, wherein the data storage device has a plurality of chips, each of the chips includes a plurality of pages which are numbered 0~M according to the locations of the pages in the chips, the pages with number M of at least one first chip constitute a RAID parity area, and the other pages constitute a data area. The data maintenance method includes encoding data to be stored to obtain a first parity code; temporarily storing the first parity code in a random access memory, and writing the data to be stored into the data area according to a first predetermined writing order, wherein the first predetermined writing order is sequentially writing the data to be stored from the pages with number 0 of the chips to the pages with number 1 of the chips, and so on until all of the data to be stored is written into the data area; and writing the first parity code into the RAID parity area in sequence when all of the bits of the data to be stored are stored into the data area.

Another exemplary embodiment provides a data maintenance method applied to a data storage device, wherein the data storage device includes a plurality of chips, each of the chips includes a plurality of pages are numbered 0~M according to the locations of the pages in the chips, and the pages with number 0~K−2 of at least one first chip and the pages with number 0~K−1 of at least one second chip except for the first chip constitute a data area, the pages with number K−1~M of the first chip and the pages with number K~M of the second chip constitute a RAID parity area. The data maintenance method includes: dividing data to be stored into a plurality of data groups according to a predetermined length; encoding the data groups to obtain a plurality of first parity codes; temporarily storing the first parity codes in a random access memory, and writing the data to be stored into the data area according to a first predetermined writing order, wherein the first predetermined writing order is sequentially writing the data to be stored from the pages with number 0 of the chips to the pages with number 1 of the chips, and so on until all of the data to be stored is written into the data area; and writing the first parity codes into the RAID parity area in sequence according to a second predetermined writing order when all of the bits of the data to be stored are stored into the data area, wherein the second predetermined writing order is sequentially writing the first parity codes from the pages with number K−1 of the first chip to the pages with number K of the chips, and so on until all of the bits of the first parity codes are written into the RAID parity area.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
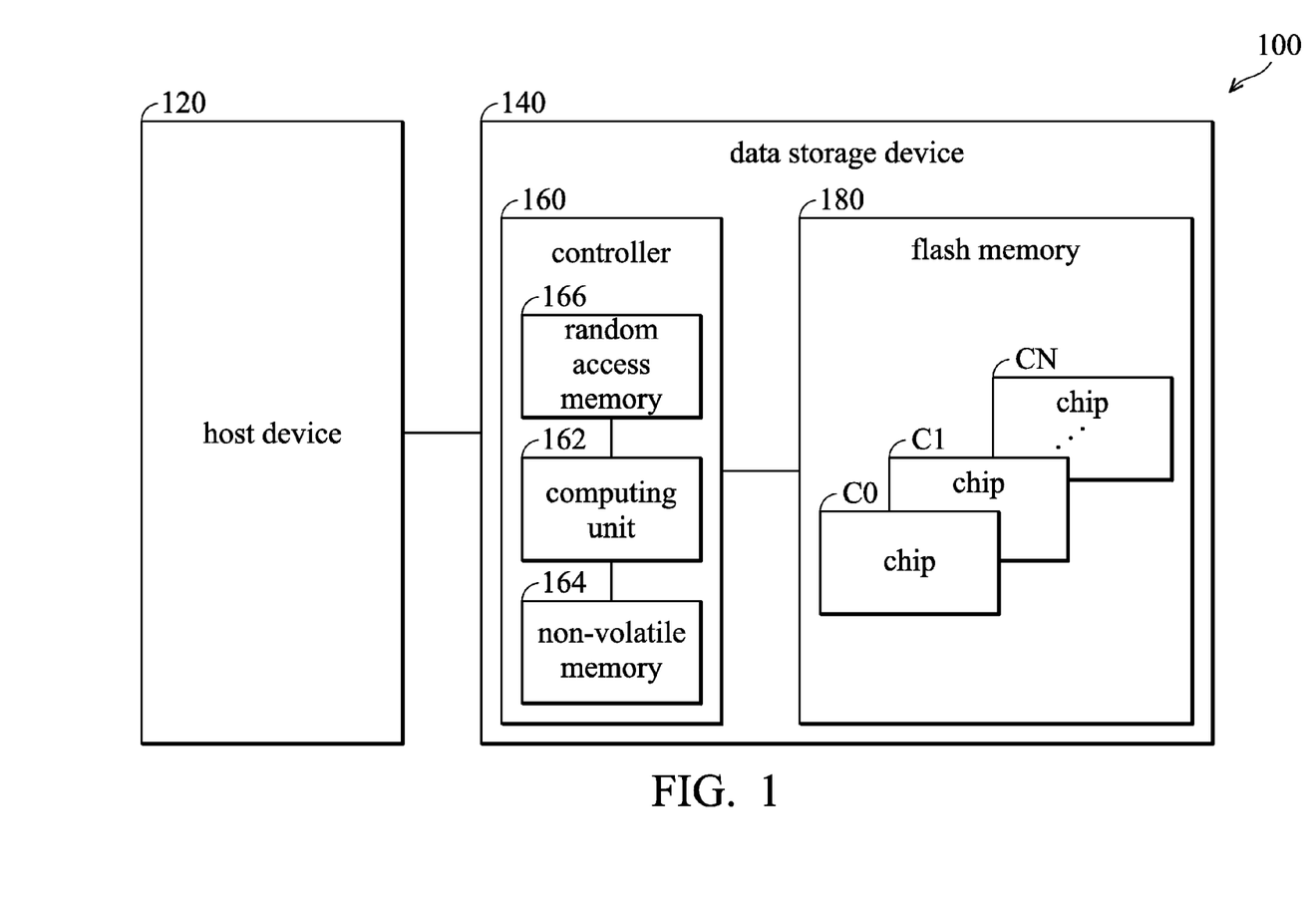
FIG. 1 is a schematic diagram illustrating an embodiment of an electronic system of an exemplary embodiment.

FIG. 1 is a schematic diagram illustrating an embodiment of an electronic system of an exemplary embodiment. The electronic system 100 includes a host device 120 and a data storage device 140. The data storage device 140 includes a flash memory 180 and a controller 160. Furthermore, the data storage device 140 can operate in response to commands received from the host device 120.

Figure 4:
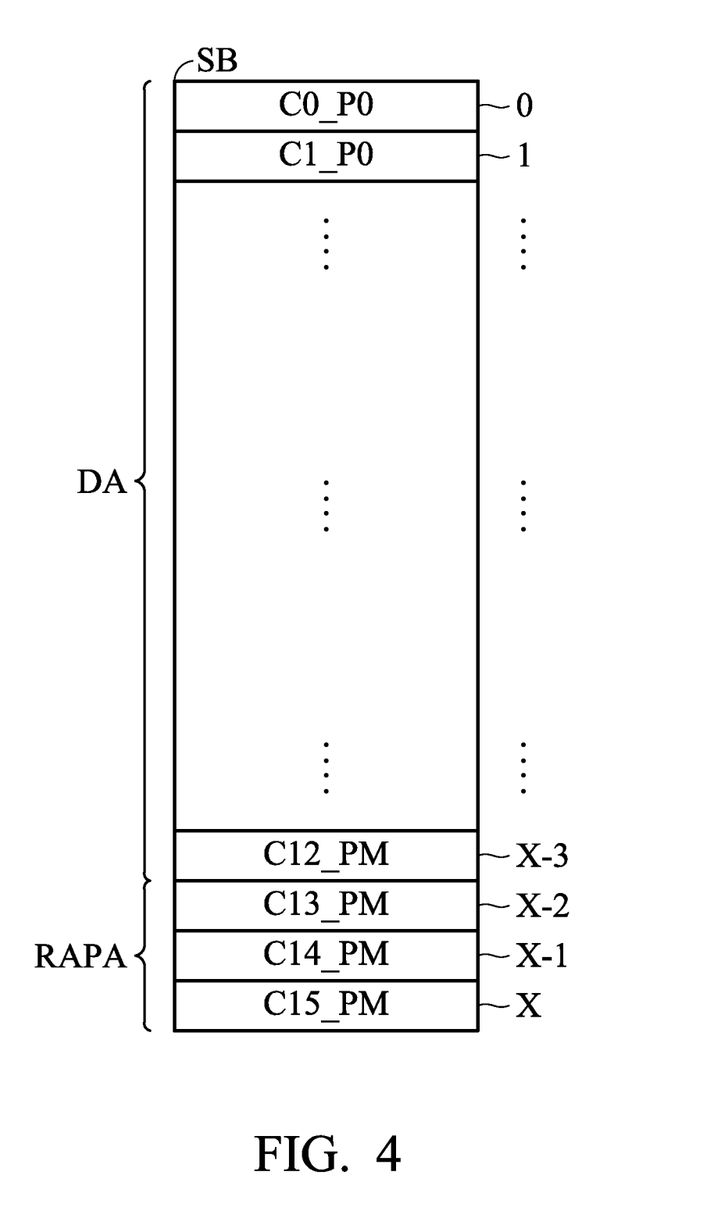
FIG. 4 is a schematic diagram illustrating an embodiment of a data area and a RAID parity area of the super block of an exemplary embodiment.
Figure 5A:
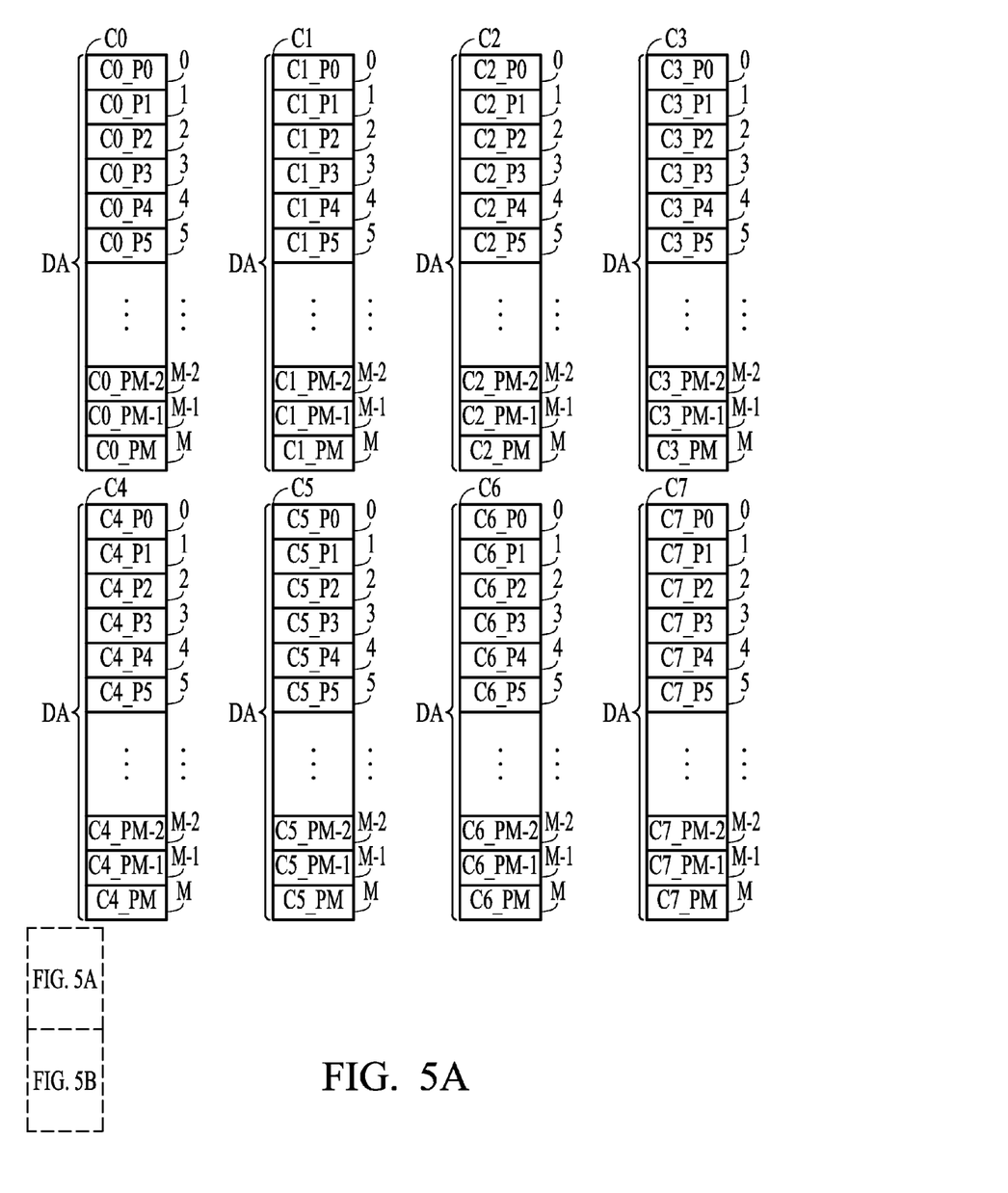
FIG. 5A~5B is a schematic diagram illustrating an embodiment of data areas and RAID parity areas of the flash memory of an exemplary embodiment.
Figure 5B:
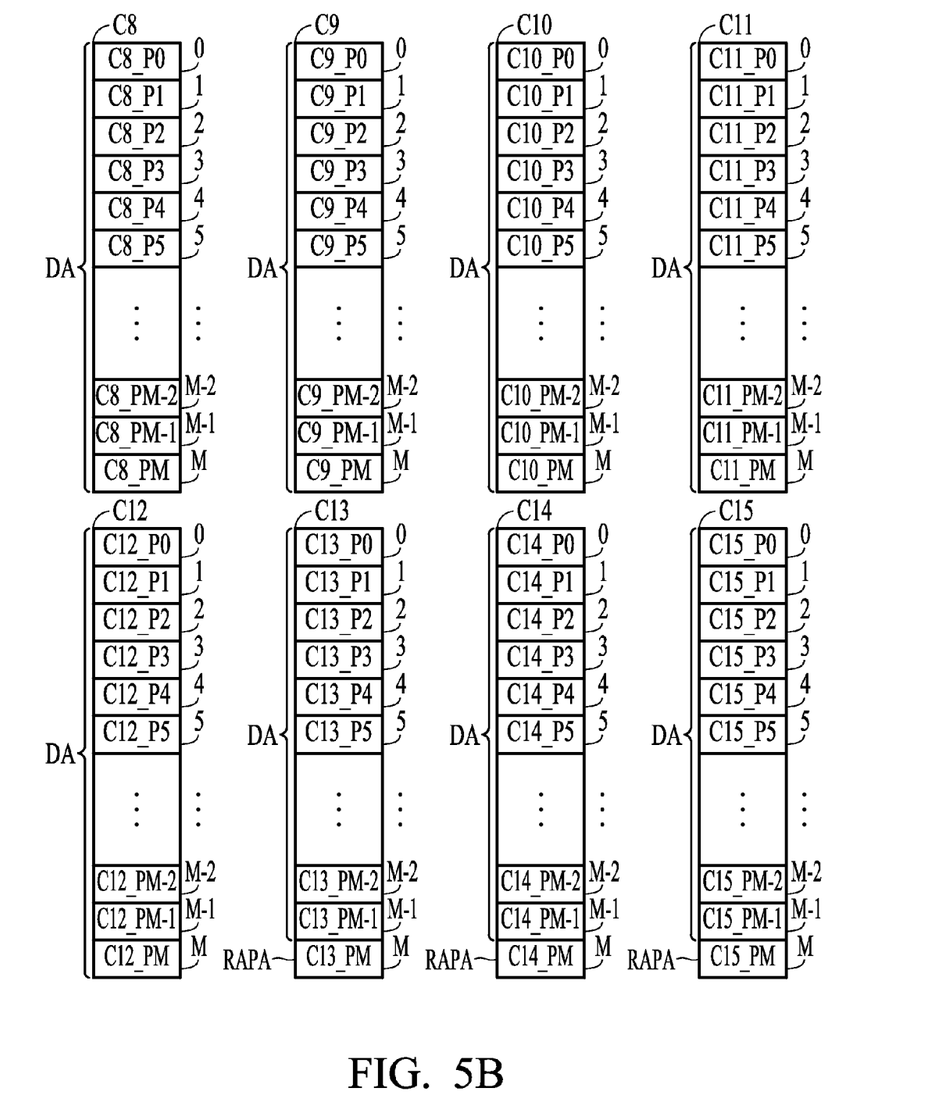

The controller 160 includes a computing unit 162, a non-volatile memory 164 (such as read only memory), and a random access memory 166. The program code and data stored in the nonvolatile memory 164 may constitute firmware, and be performed by the computing unit 162, such that the controller 160 may control the flash memory 180 by the firmware. The computing unit 162 is further arranged to restructure the pages of the flash memory 180 into a super block. Moreover, the computing unit 162 further includes an error correction engine (not shown). The error correction engine is arranged to perform an error correction on the retrieved data when the data of the retrieved data is not correct, but it is not limited thereto. For example, the error correction engine may be arranged to encode the data to be stored in the data area DA (as shown in FIG. 4 and FIG. 5) to obtain a parity code, and correct the data stored in the data area DA by using the parity code stored in the RAID parity area RAPA (as shown in FIG. 4 and FIG. 5) when the data cannot be successfully read.

The flash memory 180 includes a plurality of chips C1-CN. Each of the chips C1-CN includes a plurality of pages, a plurality of word lines and a plurality of bit lines, wherein each of the word lines is arranged to control at least one of the pages for selecting the pages. For example, when the flash memory 180 is the Single-Level Cell, each of the word lines is arranged to control one page. When the flash memory 180 is the Multi-Level Cell, each of the word lines is arranged to control two pages. When the flash memory 180 is the Triple-Level Cell, each of the word lines is arranged to control three pages, but it is not limited thereto. The pages of the chips C0-CN constitute a super block SB according to a predetermined arrangement order, as shown in FIG. 3.

The pages of the super block SB are numbered 0~X from the top to the bottom of the super block SB, the pages with numbers 0~Y-1 of the super block SB constitute a data area DA, and the pages with numbers Y~X of the super block SB constitute a RAID parity area, wherein the data area DA constituted by the pages with numbers 0~Y-1 of the super block SB is arranged to store data, and the RAID parity area constituted by the pages with numbers Y~X of the super block SB is arranged to store the parity codes. It should be noted that X is an integer greater than 1, and Y is an integer greater than 1 and less than X. In another embodiment, the data area DA may include a plurality of data groups RG0~RGN, wherein the pages with numbers Y~Z-1 of the RAID parity area RAPA are arranged to store a plurality of first parity codes produced by encoding the data of the data groups RG0~RGN, and the pages with numbers Z~X of the RAID parity area RAPA are arranged to store a second parity code produced by encoding the first parity codes. It should be noted that Z is an integer greater than Y and less than X. Moreover, in one embodiment, the parity codes are Redundant Array of Independent Disks (RAID) parity codes.

Figure 2A:
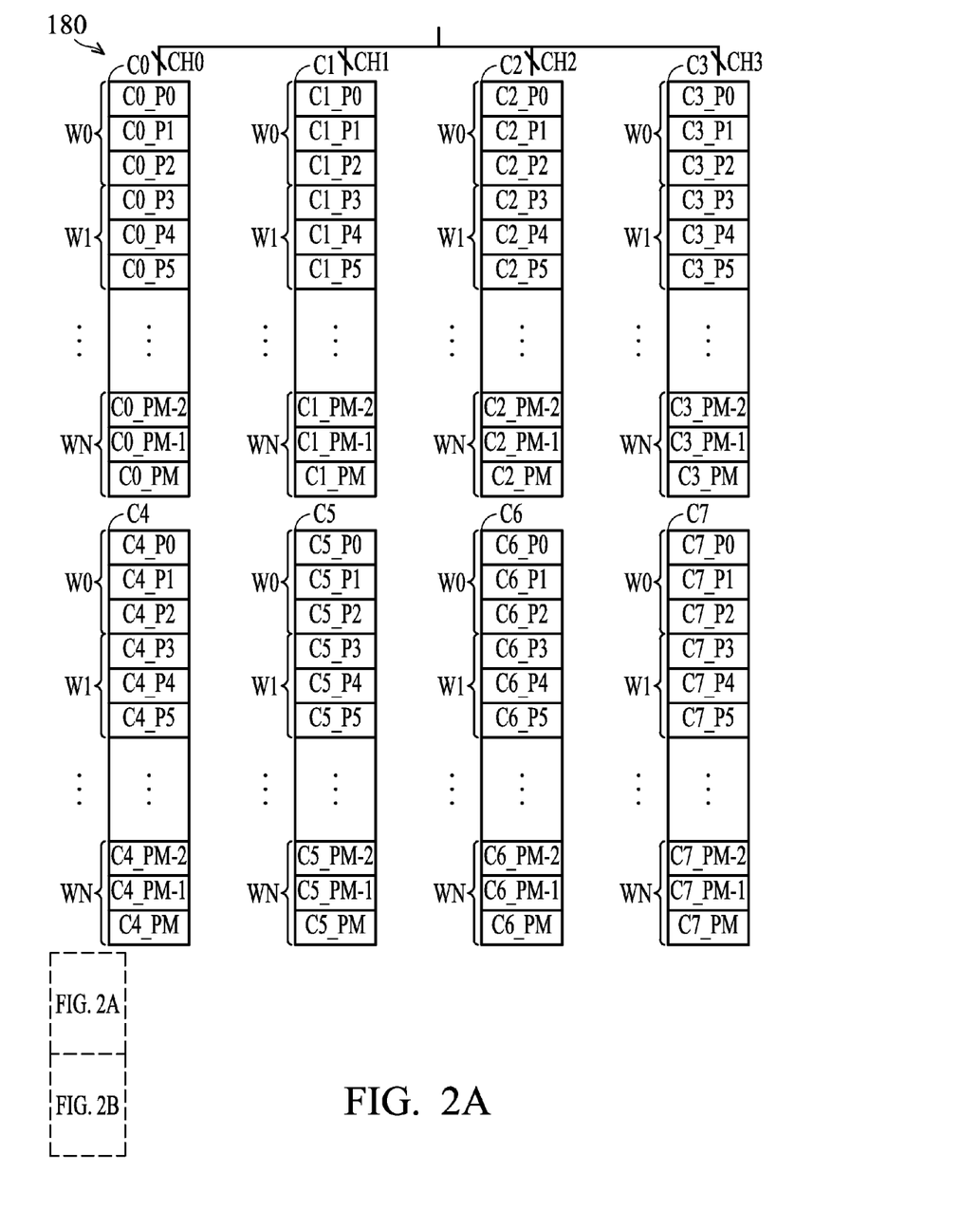
FIG. 2A~2B is a schematic diagram illustrating an embodiment of a flash memory of an exemplary embodiment.
Figure 2B:
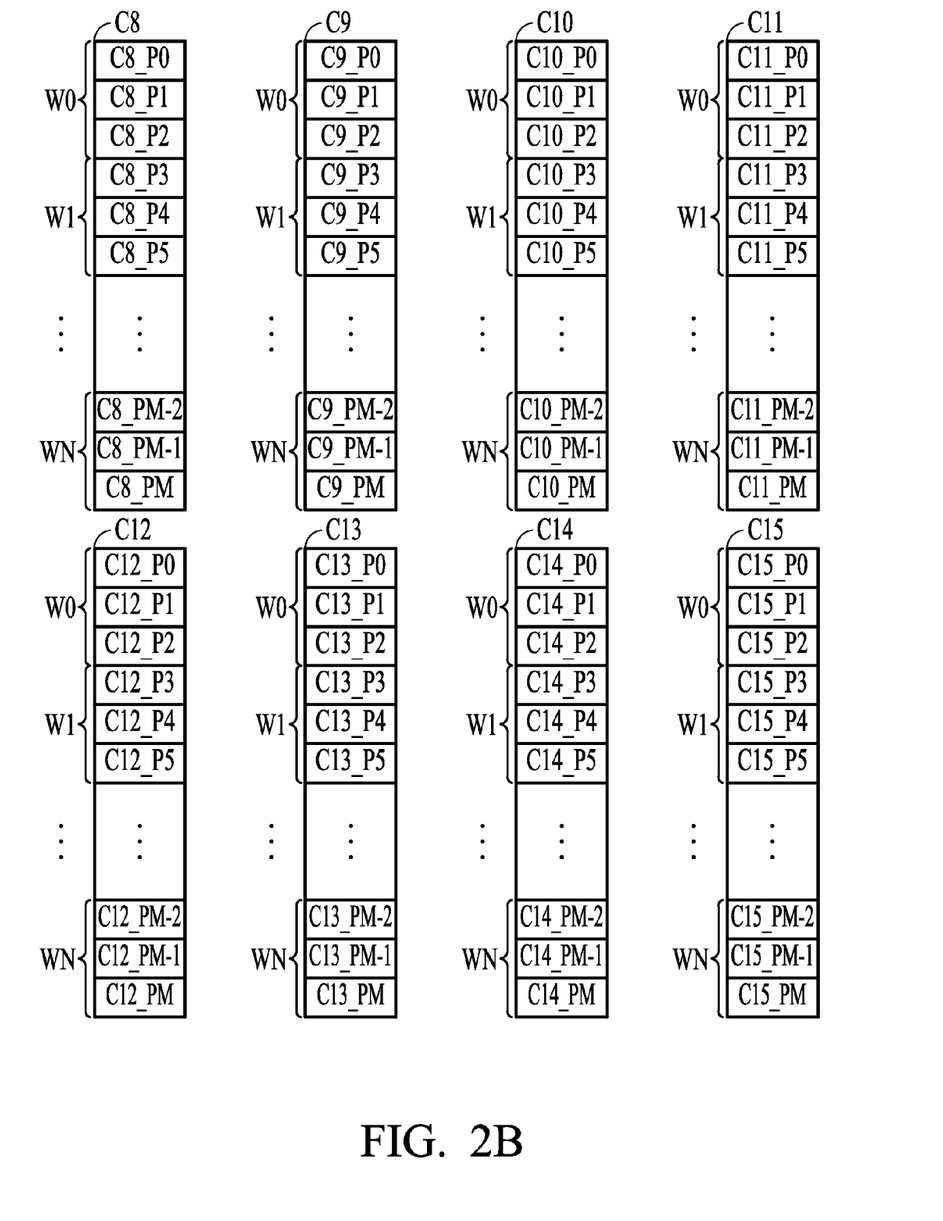

FIG. 2A~2B is a schematic diagram illustrating an embodiment of a flash memory of an exemplary embodiment. As shown in FIG. 2, the flash memory 180 includes sixteen chips C0-C15, and each of the channels CH1-CH4 is arranged to control four chips, but it is not limited thereto. The flash memory 180 may include other quantities of chips and channels. Moreover, each of the chips C0-C15 includes a plurality of pages. For example, the chip C0 includes the pages C0_P0-C0_PM, the chip C1 includes the pages C1_P0-C1_PM, the chip C0 includes the pages C2_P0-C2_PM, the chip C3 includes the pages C3_P0-C3_PM, and so on. It should be noted that, in this embodiment, the flash memory 180 is the Triple-Level Cell, such that each of the word lines W0-WN is arranged to control three pages, but it is not limited thereto. In other embodiments, the flash memory 180 may be the single-Level Cell or Multi-Level Cell.

Figure 3:
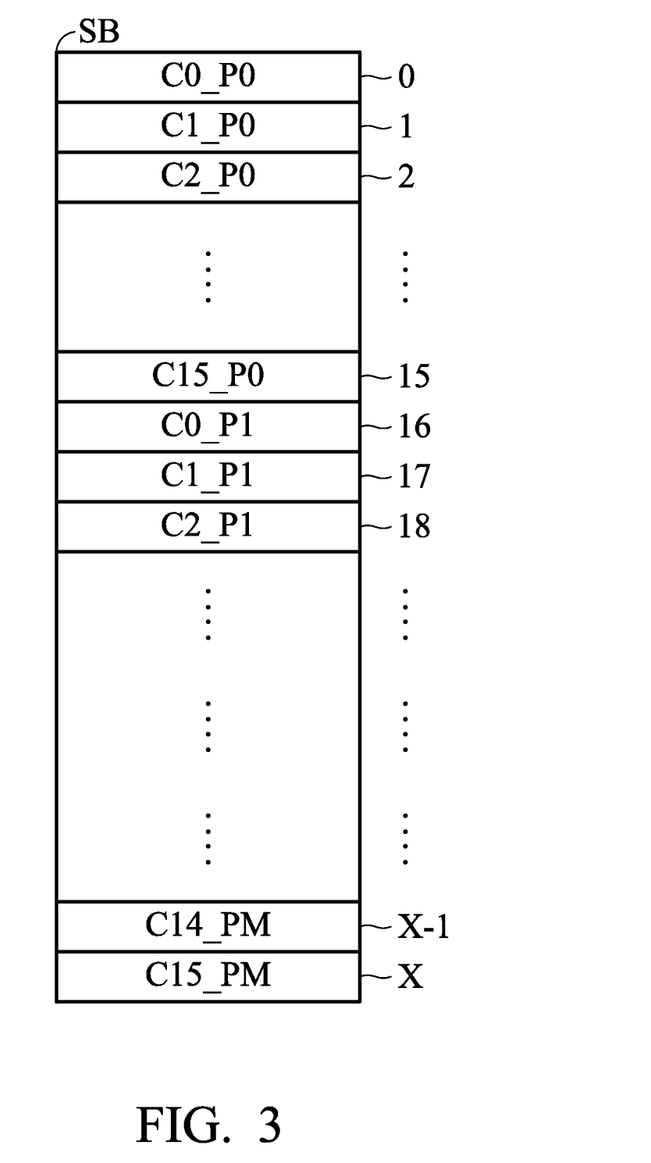
FIG. 3 is a schematic diagram illustrating an embodiment of a super block of an exemplary embodiment.

FIG. 3 is a schematic diagram illustrating an embodiment of a super block of an exemplary embodiment, wherein the pages of the sixteen chips C0-C15 of the flash memory 180 of FIG. 2 constitute a super block SB according to a predetermined arrangement order in FIG. 3. As FIG. 3 shown, the predetermined arrangement order is from a first page at the top of each of the chips, to a second page next to the first page of each of the chips C0-CN, till the last page at the bottom of each of the chips C0-CN. For example, the page with number 0 of the super block SB is the first page C0_P0 with number 0 of the chip C0, the page with number 1 of the super block SB is the first page C1_P0 with number 0 of the chip C1, the page with number 2 of the super block SB is the first page C2_P0 with number 0 of the chip C2, and so on. The sixteenth page with number 15 of the super block SB is the first page C15_P0 with number 0 of the chip C15. Next, the page with number 16 of the super block SB is the second page C0_P1 with number 1 of the chip C0, the page with number 17 of the superblock is the second page C1_P1 with number 1 of the chip C1, the page with number 18 of the super block SB is the second page C2_P1 with number 1 of the chip C2, and so on. The pages with number X-1 and X of super block SB are the last page C14_PM with number M of the chip C14 and the last page C15_PM with number M of the chip C15.

FIG. 4 is a schematic diagram illustrating an embodiment of a data area and a RAID parity area of the super block of an exemplary embodiment, wherein the super block SB of FIG. 4 is similar to the super block SB of FIG. 3. In this embodiment, the RAID parity area RAPA is constituted by the last three pages with numbers X-2, X-1 and X of the super block SB which are the pages C13_PM, C14_PM and C15_PM. Namely, in this embodiment, Y=X-2. As shown in FIG. 4, the page with numbers 0~X-3(0~Y-1) of the super block SB constitute the data area DA, and the pages with numbers X-2~X(Y~X) of the super block SB constitute the RAID parity area RAPA, but it is not limited thereto. In other embodiments, the RAID parity area RAPA can constituted by the last one, two, three, four, five or ten twenty page(s) on the bottom of the super block SB. Moreover, the pages with numbers Y~X of the RAID parity area RAPA are arranged to store a first parity code produced by coding the data to be stored in the pages with numbers 1~Y-1, and the first parity code is arranged to correct the data stored in the data area DA when the data cannot be successfully read. It should be noted that, in another embodiment, the data area DA includes a plurality of data sectors, wherein each of the data sectors has one parity code. Namely, the first parity code is constituted by a plurality of parity codes corresponding to the different data sectors.

FIG. 5A~5B is a schematic diagram illustrating an embodiment of data areas and RAID parity areas of the flash memory of an exemplary embodiment. In FIG. 5, each of the chips C0-CN includes a plurality of pages numbered by 0~M, and the pages with number M of at least one first chip C13~C15 of the chips C0~CN constitute the RAID parity area RAPA, and the other pages of the chips C0~CN constitute the data area DA. In this embodiment, the RAID parity area RAPA is the last pages C13_PM, C14_PM and C15_PM of the last three chips, but it is not limited thereto.

Figure 6:
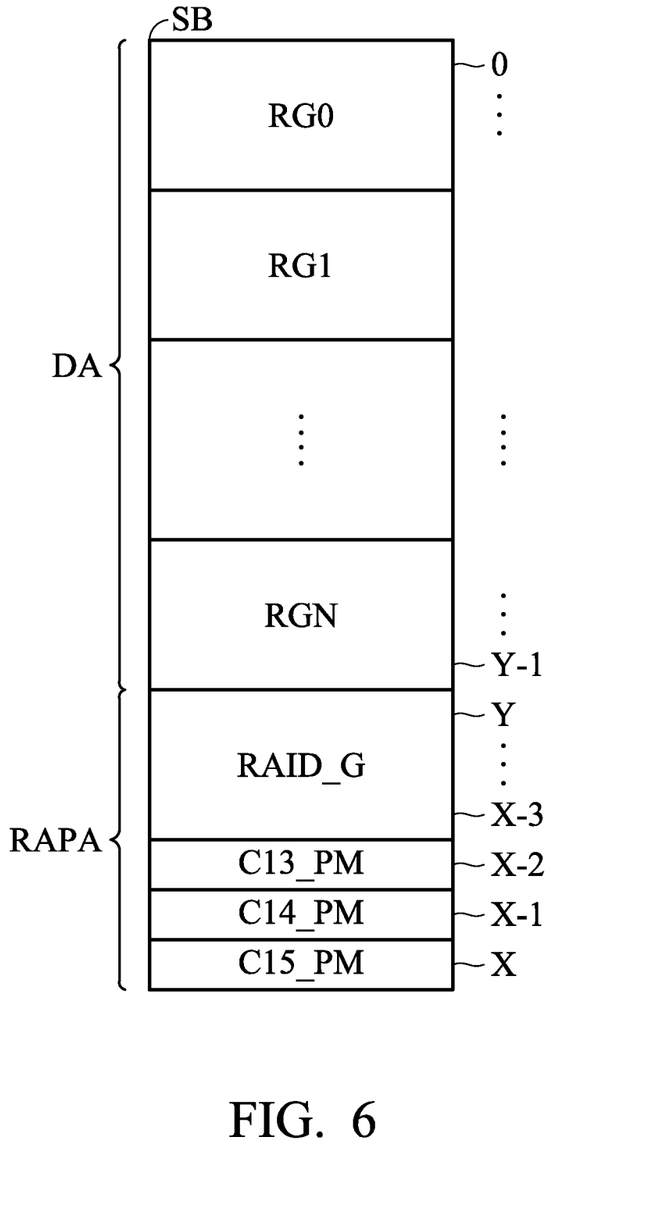
FIG. 6 is a schematic diagram illustrating another embodiment of a data area and a RAID parity area of the super block of an exemplary embodiment.

FIG. 6 is a schematic diagram illustrating another embodiment of a data area and a RAID parity area of the super block of an exemplary embodiment, wherein the super block SB is similar to the super block SB of FIG. 3. It should be noted that, in this embodiment, the data area DA is divided into a plurality of data groups RG0~RGN, and the RAID parity area RAPA further includes a parity group RAID_G arranged to store a plurality of first parity codes produced by coding the data of the data groups RG0~RGN, wherein the data groups RG0~RGN are arranged top-down in the super block SB, and each of the data groups RG0~RGN has at least one page of each of the chips C0-CN. Moreover, the last three pages C13_PM, C14_PM and C15_PM with numbers X−2, X−1 and X of the RAID parity area RAPA are arranged to store a second parity code produced by coding the data of the parity group RAID_G, but it is not limited thereto. Namely, in this embodiment, Z=X−2. The pages with numbers Y~X−3(Y~Z−1) of the RAID parity area RAPA are arranged to store a plurality of first parity codes produced by coding the data of each of the data groups RG0~RGN. The first parity codes are arranged to correct the data of the corresponding data group when the data of the corresponding data group cannot be successfully read. The pages with numbers X−2~X(Z~X) of the RAID parity area RAPA are arranged to store a second parity code produced by encoding the first parity codes. The second parity code is arranged to correct the first parity codes when the first parity code cannot be successfully read. It should be noted that, in one embodiment, the data area DA includes a plurality of data sectors, wherein each of the data sectors has a parity code. Moreover, in another embodiment, the second parity code also can be constituted by the parity codes produced by encoding the data sectors divided from the parity group RAID_G. Namely, each of the first parity codes and the second parity code is constituted by the parity codes corresponding to the different data sectors.

Figure 7A:
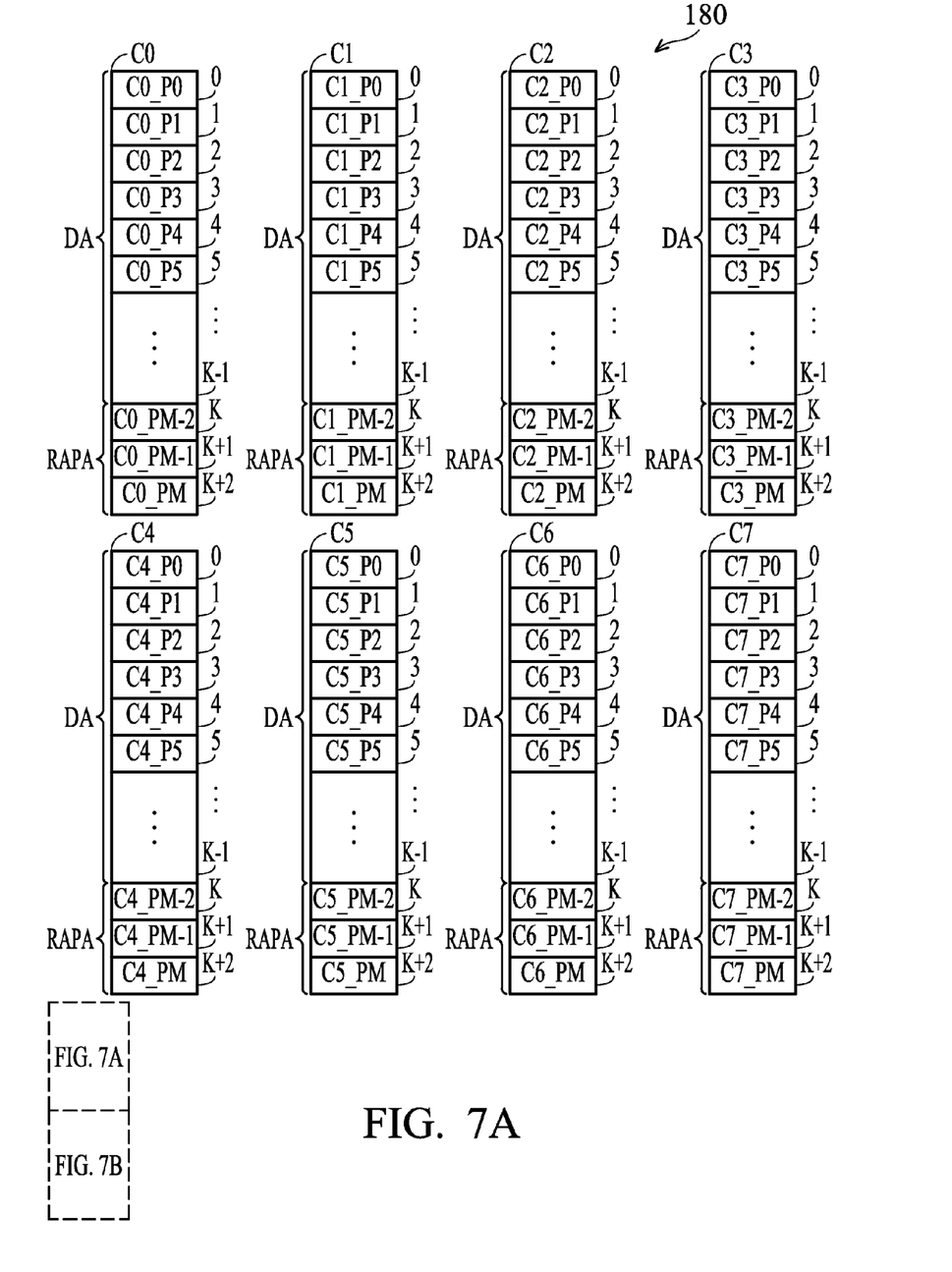
FIG. 7A~7B is a schematic diagram illustrating another embodiment of data areas and RAID parity areas of the flash memory of an exemplary embodiment.
Figure 7B:
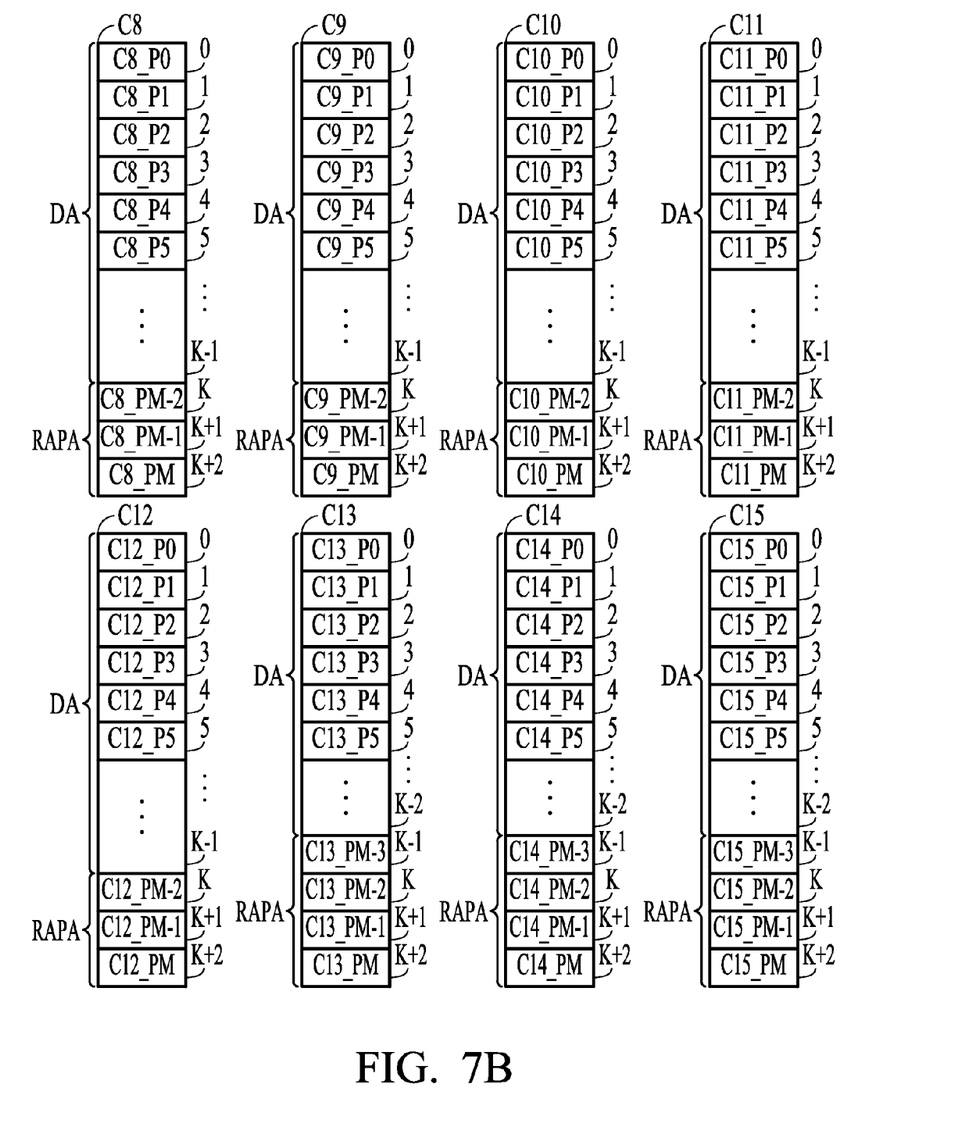

FIG. 7A~7B is a schematic diagram illustrating another embodiment of data areas and RAID parity areas of the flash memory of an exemplary embodiment. In FIG. 7, each of the chips C0~CN includes a plurality of pages numbered by 0~M, wherein the pages with numbers 0~K−2 of at least one first chip of chips C0~CN and the pages with numbers 0~K−1 of the chips except for the first chip constitute a data area DA, and the pages with numbers K−1~M of the first chip and the pages with numbers K~M of the second chip C0~CN constitute a RAID parity area RAPA. In this embodiment, the first chips include the chips C13, C14 and C15, and the second chips includes the chips C0~C12, but it is not limited thereto. More specifically, the last three pages page C13_PM, C14_PM and C15_PM of the super block SB of the last three chips in the RAID parity area RAPA are arranged to store the second parity code, the other forty-eight pages in the RAID parity area RAPA are arranged to store the first parity code (parity group RAID_G), but it is not limited thereto.

Figure 8:
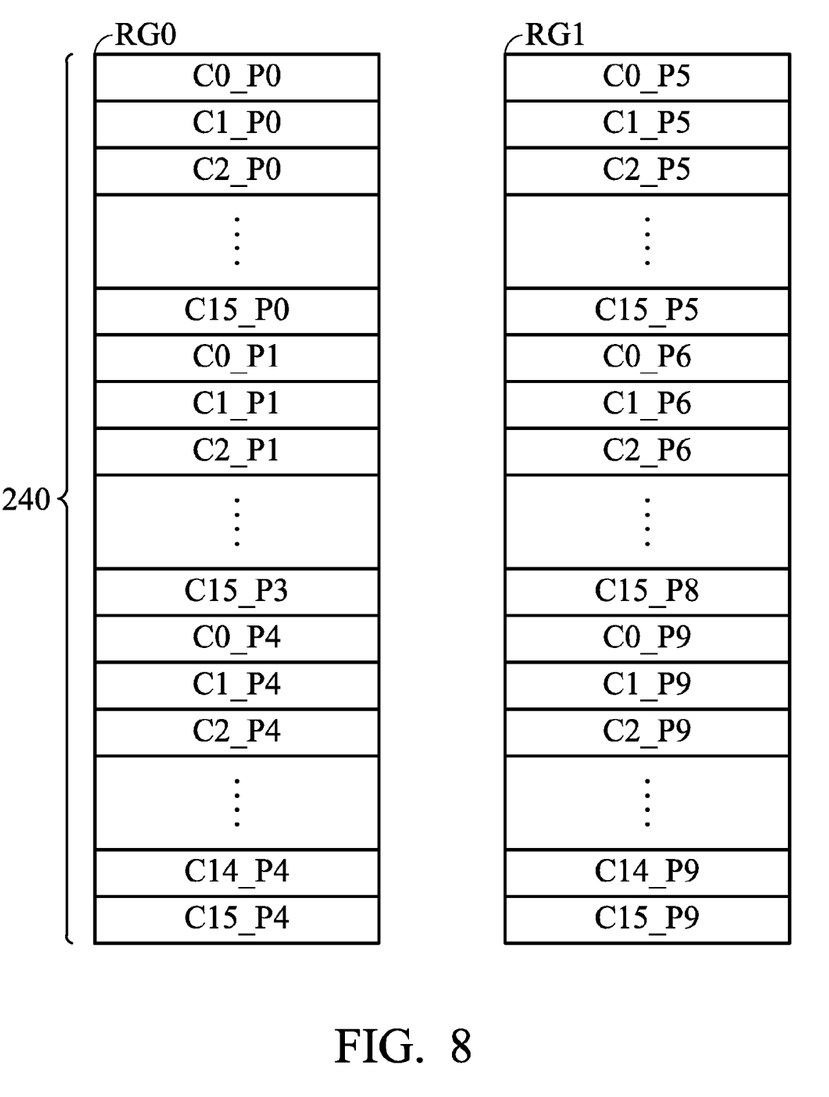
FIG. 8 is a schematic diagram illustrating an embodiment of a data group of an exemplary embodiment.

For example, in one embodiment of the present invention, each of the data groups RG0~RGN has two hundred forty pages controlled by five word lines of the sixteen chips, as shown in FIG. 8. Each of the data groups RG0~RGN is arranged to produce a first parity code of three pages. When the data area DA has sixteen data groups RG0~RG15, the forty-eight pages on the bottom of the parity group RAID_G are arranged to store a plurality of first parity codes. Next, the controller 160 encodes the first parity code which is stored in the forty-eight pages of the parity group RAID_G to produce the amount of three pages of the second parity code. It should be noted that the controller 160 can produce the parity codes with a predetermined length, such as three pages, but it is not limited thereto. In other embodiments, the controller 160 can also produce the parity codes with 1, 2, 4, 5, 10 or 20 pages, etc.

Figure 9:
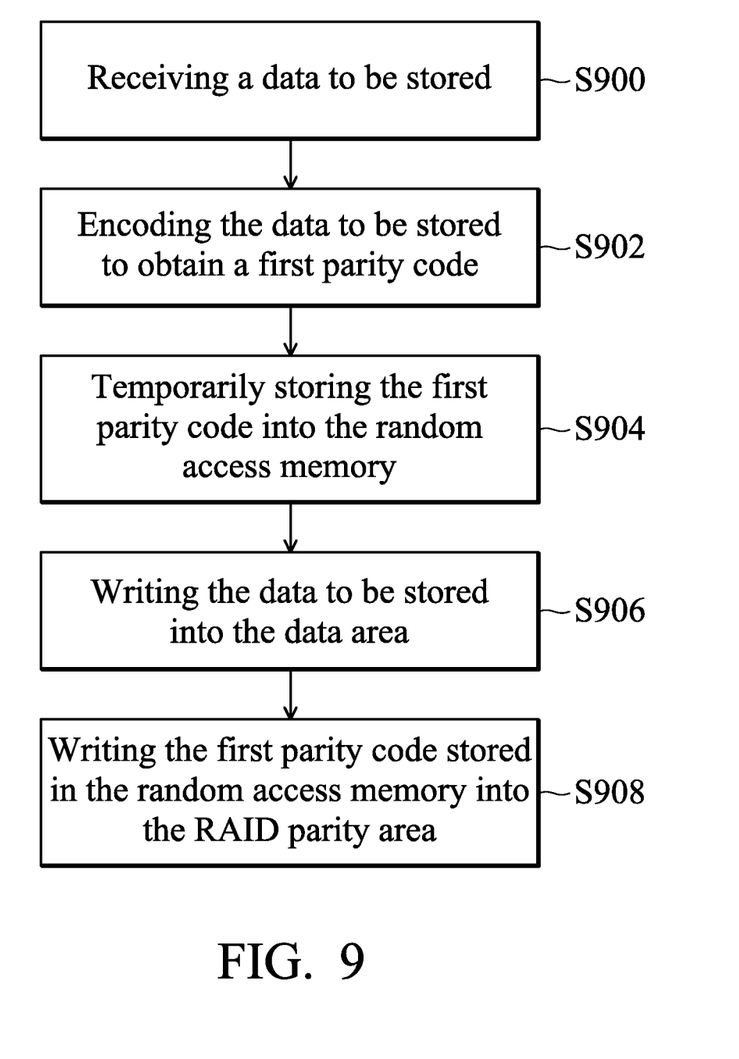
FIG. 9 is a flowchart of a data maintenance method according to exemplary embodiments.

FIG. 9 is a flowchart of a data maintenance method according to exemplary embodiments. The data maintenance method is applied to the super block SB of FIG. 4 and the super block SB of FIG. 5. The super block SB has pages numbered by 0~X from the top to the bottom of the super block SB, the pages with numbers 0~Y−1 of the super block SB constitute a data area DA, and the pages with numbers Y~X of the super block SB constitute a RAID parity area, wherein the data area DA constituted by the pages with numbers 0~Y−1 of the super block SB is arranged to store data, and the RAID parity area constituted by the pages with numbers Y~X of the super block SB is arranged to store the parity codes. Namely, each of the chips C0-CN has a plurality of pages numbered by 0~M, the pages with number M of at least one first chip of chips C0~CN constitute the RAID parity area RAPA, the other pages of the chips C0~CN constitute the data area DA. The process starts at step S900.

In step S900, the data storage device 140 receives data to be stored from the host device 120 or other devices.

Next in step S902, the controller 160 encodes the data to be stored to obtain a first parity code.

Next in step S904, the controller 160 temporarily stores the first parity code into the random access memory 166.

Next in step S906, the controller 160 sequentially writes the data to be stored into the data area DA according to a first predetermined writing order, wherein the first predetermined writing order is sequentially writing the data to be stored from the pages with number 0 of the chips C0~CN to the pages with number 1 of the chips C0~CN, and so on until all of the data to be stored is written into the data area DA, as shown in FIG. 5. Namely, the controller 160 sequentially writes the data to be stored into the data area DA of the super block SB from the page with number 0 to the page with number Y−1, as shown in FIG. 4.

Next in step S908, when the data to be stored has been written into the data area DA, the controller 160 sequentially writes the first parity code stored in the random access memory 166 into the RAID parity area RAPA. For example, the controller 160 writes the first parity code into the page C13_PM with number M of the chip C13, and continues to write the first parity code into the page C14_PM with number M of the chip C14 when the page C13_PM is full, and write the remained first parity code into the page C15_PM with number M of the chip C15, as shown in FIG. 5.

It should be noted that, in one embodiment, the controller 160 divides the data to be stored into a plurality of data sectors, and encodes each of the data sectors, wherein each of the data sectors has a parity code. Namely, the first parity code is constituted by a plurality of parity codes corresponding to the different data sectors. The controller writes the parity code into the random access memory 166 once the parity code is produced, and writes all of the parity codes stored in the RAID parity area RAPA of the random access memory 166 after the data to be stored is written into the data area DA. The process ends at step S908.

Figure 10:
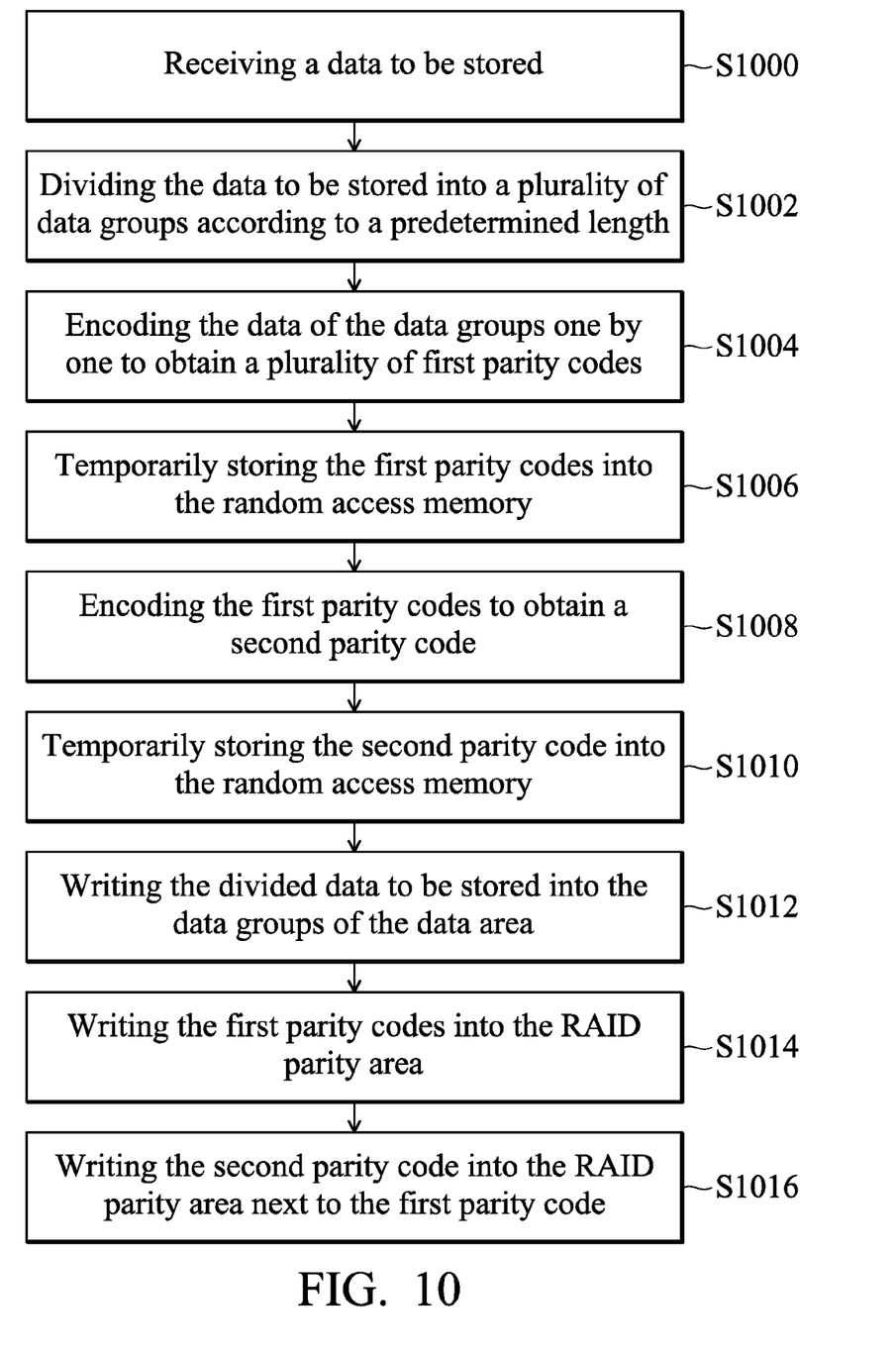
FIG. 10 is a flowchart of another data maintenance method according to exemplary embodiments.

FIG. 10 is a flowchart of another data maintenance method according to exemplary embodiments. The data maintenance method is applied to the super block SB of the FIG. 6 and the super block SB of FIG. 7. The super block SB has a plurality of pages numbered by 0~X from the top to bottom of the super block SB, the pages with numbers 0~Y−1 of the super block SB constitute a data area DA, and the pages with numbers Y~X of the super block SB constitute a RAID parity area, wherein the data area DA constituted by the pages with numbers 0~Y−1 of the super block SB is arranged to store data, and the RAID parity area constituted by the pages with numbers Y~X of the super block SB is arranged to store the parity codes. It should be noted that, in this embodiment, the data area DA is divided into a plurality of data groups RG0~RGN, and the RAID parity area RAPA further includes a parity group RAID_G arranged to store a plurality of first parity codes produced by coding the data of the data groups RG0~RGN, wherein the data groups RG0~RGN are arranged top-down in the super block SB, and each of the data groups RG0~RGN has at least one page of each of the chips C0-CN. Moreover, the last three pages C13_PM, C14_PM and C15_PM with numbers X−2, X−1 and X of the RAID parity area RAPA are arranged to store a second parity code produced by coding the data of the parity group RAID_G, but it is not limited thereto. Namely, the data storage device 140 has a plurality of chips C0~CN. Each of the chips C0~CN has pages numbered by 0~M, the pages with numbers 0~K−2 of at least one first chip of chips C0~CN and the pages with numbers 0~K−1 of the chips except for the first chip constitute a data area DA, and the pages with numbers K−1~M of the first chip and the pages with numbers K~M of the second chip C0~CN constitute a RAID parity area RAPA. The process starts at step S1000.

In step S1000, the data storage device 140 receives data to be stored from the host device 120 or other devices.

Next in step S1002, the controller 160 divides the data to be stored into a plurality of data groups according to a predetermined length for storing the data into the data groups RG0~RGN of the data area DA. In one embodiment, each of the data groups RG0~RGN has two hundred forty pages controlled by five word lines of the sixteen chips, but it is not limited thereto. Namely, the predetermined length is the length of 240 pages.

Next in step S1004, the controller 160 encodes the data of the data groups one by one to obtain a plurality of first parity codes.

Next in step S1006, the controller 160 temporarily stores the first parity codes into the random access memory 166.

Next in step S1008, the controller 160 encodes the first parity codes to obtain a second parity code.

Next in step S1010, the controller 160 temporarily stores the second parity code into the random access memory 166.

Next in step S1012, the controller 160 sequentially writes the divided data to be stored into the data groups RG0~RGN of the data area DA according to a first predetermined writing order. The first predetermined writing order is sequentially writing the data to be stored from the pages with number 0 of the chips C0~CN to the pages with number 1 of the chips C0~CN, and so on until all of the data to be stored is written into the data area DA, as shown in FIG. 7. Namely, the controller 160 sequentially writes data to be stored into the data area DA of the super block SB according to the direction from the page with number 0 to the page with number Y−1, as shown in FIG. 6.

Next in step S1014, when the data to be stored has been written into the data area DA, the controller 160 writes the first parity codes into the RAID parity area RAPA according to a second predetermined writing order. The second predetermined writing order is sequentially writing the first parity codes from the pages with number K−1 of the first chip to the pages with number K of the chips, and so on until all of the bits of the first parity codes are written into the RAID parity area RAPA, as shown in FIG. 7. For example, the controller 160 writes one of the first parity code into the page C13_PM-3 of the chip C1, the page C14_PM-3 of the chip C14 and the page C15_PM-3 of the chip C15, and writes another one of the first parity code into the page C0_PM-2 of the chip C0, the page C1_PM-2 of the chip C1 and page C2_PM-2 of the chip C2, and so on until all of the first parity codes are written into the RAID parity area RAPA, but it is not limited thereto. Each of the first parity code may also less than the length of tree pages.

Next in step S1016, when all of the first parity codes are written into the RAID parity area RAPA, the controller 160 continues the second predetermined writing order to write the second parity code into the RAID parity area RAPA next to the first parity code. In the embodiment of FIG. 7, the controller 160 writes the second parity code into the page C13_PM with number M of the chip C13, the page C14_PM with number M of the chip C14 and the page C15_PM with number M of the chip C15.

It should be noted that, in one embodiment, the controller 160 divides the data of each data group into a plurality of data sectors for encoding each of the data sectors, wherein each of the data sectors is arranged to produce a parity code. Namely, each of the first parity codes constitutes a plurality of parity codes corresponding to different data sectors. When all of the first parity codes are produced, the controller 160 divides the data of the parity groups RAID_G constituted by the first parity codes into a plurality of data sectors, and each of the data sectors divided from the parity groups RAID_G has a parity code. Namely, the second parity code is constituted by a plurality of parity codes. The controller 160 writes the parity code into the random access memory 166 while the parity code is produced, and writes all of the parity codes stored in the random access memory 166 into the RAID parity area RAPA after the data to be stored are written into the data area DA. The process ends at step S1016.

The data storage device 140 of the present invention may store all of the parity codes in the bottom of the super block SB, such that the performance of reading the data is improved. Genially, the parity code is stored next to the corresponding data. Moreover, the data storage device 140 can protect the parity codes by encoding the parity codes into another parity code.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, comprising a plurality of chips, each of the chips comprises a plurality of pages for storing data, the pages of the chips are arranged to assemble into a super block according to a predetermined arrangement order, the pages of the super block are numbered 0~X from top to bottom, wherein the pages with number 0~Y−1 constitute a data area and the pages with numbers Y~X constitute a RAID parity area, wherein X is an integer greater than 1, and Y is an integer greater than 1 and less than X; and
   a controller, storing at least one parity code into the RAID parity area after all of the data is stored into the data area, and performing an error correction to correct data of the data area of the flash memory by using data of the RAID parity area when the controller cannot successfully read the data of the data area.

2. The data storage device as claimed in claim 1, wherein the controller further encodes the data stored in the data area to produce a first parity code, wherein the first parity code is stored in the pages with numbers Y~X of the RAID parity area, and the first parity code is arranged to correct the data stored in the data area when the data stored in the data area cannot be successfully read.

3. The data storage device as claimed in claim 1, wherein the data area has a plurality of data groups.

4. The data storage device as claimed in claim 3, wherein the controller further encodes the data stored in the data groups to produce a plurality of first parity codes, wherein the first parity codes are stored in the pages with numbers Y~Z−1 of the RAID parity area, and the first parity codes are arranged to correct the data stored in the corresponding data group when the data stored in the corresponding data area cannot be successfully read, wherein Z is an integer greater than Y and less than X.

5. The data storage device as claimed in claim 4, wherein the controller further encodes the first parity codes to produce a second parity code, wherein the second parity code is store in the pages with numbers Z~X of the RAID parity area, and the second parity code is arranged to correct the first parity codes when the first parity code cannot be successfully read.

6. The data storage device as claimed in claim 3, wherein the data groups are arranged top-down in the super block.

7. The data storage device as claimed in claim 6, wherein each of the data groups comprises at least one of the pages of each of the chips.

8. The data storage device as claimed in claim 1, wherein the predetermined arrangement order is from a first page at the top of each of the chips, to a second page next to the first page of each of the chips, till a last page at the bottom of each of the chips.

9. A data maintenance method, applied to a data storage device, wherein the data storage device has a plurality of chips, each of the chips comprises a plurality of pages for storing data, each of the chips has a plurality of pages which are numbered 0~M according to the locations of the pages in the chips, the pages with number M of at least one first chip of the chips constitute a RAID parity area, and the remaining pages of the chips constitute a data area, the data maintenance method comprising:
   using a processor to perform the steps of:
   encoding a data to be stored to obtain a first parity code;
   temporarily storing the first parity code in a random access memory, and writing the data into the data area according to a first predetermined writing order, wherein the first predetermined writing order is writing the data into the data area in sequence until all of the bits of the data to be stored is written into the data area; and
   writing the first parity code into the RAID parity area in sequence after all of the data has been written into the data area, wherein the first parity code is arranged to correct the data to be stored of the data area when the data to be stored cannot be successfully read.

10. The data maintenance method as claimed in claim 9, wherein the pages of the chips are arranged to assemble into a super block according to a predetermined arrangement order, the pages of the super block are numbered 0~X from top to bottom of the super block, the pages with number 0~Y−1 constitute the data area, and the pages with numbers Y~X constitute the RAID parity area.

11. The data maintenance method as claimed in claim 10, wherein the predetermined arrangement order is from a first page at the top of each of the chips, to a second page next to the first page of each of the chips, till a last page at the bottom of each of the chips.

12. A data maintenance method, applied to a data storage device, wherein the data storage device comprises a plurality of chips, each of the chips comprises a plurality of pages for storing data, and the pages are numbered 0~M according to the locations of the pages in the chips, and the pages with number 0~K−2 of at least one first chip of the chips and the pages with number 0~K−1 of at least one second chip except for the first chip of the chips constitute a data area, the pages with number K−1~M of the first chip and the pages with number K~M of the second chip constitute a RAID parity area, the data maintenance method comprising:
   using a processor to perform the steps of:
   dividing a data into a plurality of data groups according to a predetermined length;
   encoding the data groups to obtain a plurality of first parity codes;
   temporarily storing the first parity codes in a random access memory, and writing the data into the data area according to a first predetermined writing order, wherein the first predetermined writing order is writing the data into the data area in sequence until all of the data is written into the data area; and
   writing the first parity codes into the RAID parity area in sequence according to a second predetermined writing order after all of the data has been written into the data area, wherein the second predetermined writing order is writing the first parity codes into the RAID parity area in sequence until all of the bits of the first parity codes are written into the RAID parity area, wherein the first parity codes are arranged to correct the data stored in the corresponding data group when the data stored in the corresponding data area cannot be successfully read.

13. The data maintenance method as claimed in claim 12, further comprising:
- encoding the first parity codes to obtain a second parity code;
- temporarily storing the second parity code into a random access memory; and
- writing the second parity code into the RAID parity area next to the first parity code according to the second predetermined writing order when all of the first parity codes are written into the RAID parity area.

14. The data maintenance method as claimed in claim 13, wherein the second parity code is arranged to correct the first parity codes when the first parity codes cannot be successfully read.

15. The data maintenance method as claimed in claim 12, wherein the pages of the chips are arranged to assemble into a super block according to a predetermined arrangement order, the pages of the super block are numbered 0~X from top to bottom of the super block, the pages with number 0~Y−1 constitute the data area, and the pages with numbers Y~X constitute the RAID parity area.

16. The data maintenance method as claimed in claim 15, wherein the predetermined arrangement order is from a first page at the top of each of the chips, to a second page next to the first page of each of the chips, till a last page at the bottom of each of the chips.

* * * * *